US009576515B2

(12) United States Patent
Tsou (10) Patent No.: US 9,576,515 B2
(45) Date of Patent: Feb. 21, 2017

(54) BRIGHT DOT DETECTION METHOD AND DISPLAY PANEL (71) Applicant: AU OPTRONICS CORP., Hsin-Chu (TW)

(72) Inventor: Kun-Feng Tsou, Hsin-Chu (TW)

(73) Assignee: AU OPTRONICS CORP., Hsin-Chu (TW)

(*) Notice: Subject to any disclaimer, the term of this patent is extended or adjusted under 35 U.S.C. 154(b) by 116 days.

(21) Appl. No.: 14/602,461

(22) Filed: Jan. 22, 2015

(65) Prior Publication Data
US 2016/0104400 A1 Apr. 14, 2016

(30) Foreign Application Priority Data

Oct. 8, 2014 (TW) .............................. 103135099 A (51) Int. Cl.
G09G 3/36 (2006.01)
G09G 3/00 (2006.01)

(52) U.S. Cl.
CPC ........... G09G 3/006 (2013.01); G09G 3/3648 (2013.01)

(58) Field of Classification Search
CPC .. G09G 3/006; G09G 3/3648; G09G 2330/08; G09G 2330/10; G09G 2330/12
See application file for complete search history.

(56) References Cited

U.S. PATENT DOCUMENTS

| 6,670,953 | B1* | 12/2003 | Ozawa | G09G 3/006 345/100 |
| 8,525,757 | B2* | 9/2013 | Nishi | G09G 3/20 345/76 |
| 2002/0167477 | A1* | 11/2002 | Tsutsui | G09G 3/3648 345/89 |
| 2009/0231255 | A1* | 9/2009 | Tanimoto | G02F 1/136286 345/87 |
| 2012/0256897 | A1* | 10/2012 | Seo | G09G 3/006 345/212 |
| 2013/0141314 | A1 | 6/2013 | Ka et al. | |
| 2013/0307557 | A1* | 11/2013 | Lee | G09G 3/006 324/522 |
| 2014/0176524 | A1* | 6/2014 | Lee | G09G 3/3233 345/212 |

(Continued)

FOREIGN PATENT DOCUMENTS

TW 577035 2/2004
TW I299849 8/2008

Primary Examiner — Joe H Cheng
(74) Attorney, Agent, or Firm — WPAT, PC; Justin King (57) ABSTRACT A bright dot detection method adapted to be used in a display panel including a plurality of gate lines, a plurality of source lines and a bright dot detection module. The plurality of gate lines and the plurality of sources line are interlaced thereby forming a plurality of pixels. The bright dot detection method includes: driving the plurality of pixels through enabling the plurality of gate lines simultaneously, thereby forming a first bright line in a first direction; and driving the plurality of pixels through enabling the plurality of gate lines sequentially and providing a control signal to the bright dot detection module, thereby forming a second bright line in a second direction, wherein a bright dot is positioned where the first and second bright lines meet with each other. A display panel is also disclosed.

14 Claims, 8 Drawing Sheets (56) References Cited

U.S. PATENT DOCUMENTS

| | | | |
|---|---|---|---|
| 2014/0354286 A1* | 12/2014 | Kim | G09G 3/006 324/414 |
| 2015/0116302 A1* | 4/2015 | Kim | G09G 3/006 345/212 |
| 2015/0214246 A1* | 7/2015 | Wu | H01L 27/124 257/347 |
| 2015/0241501 A1* | 8/2015 | Jang | G09G 3/3225 324/527 |
| 2015/0294608 A1* | 10/2015 | Li | G09G 3/3648 324/414 |

* cited by examiner

BRIGHT DOT DETECTION METHOD AND DISPLAY PANEL

TECHNICAL FIELD

The present disclosure relates to a bright dot detection method, and more particularly to a bright dot detection method capable of positioning the defect of a display panel.

BACKGROUND

Figure 1:
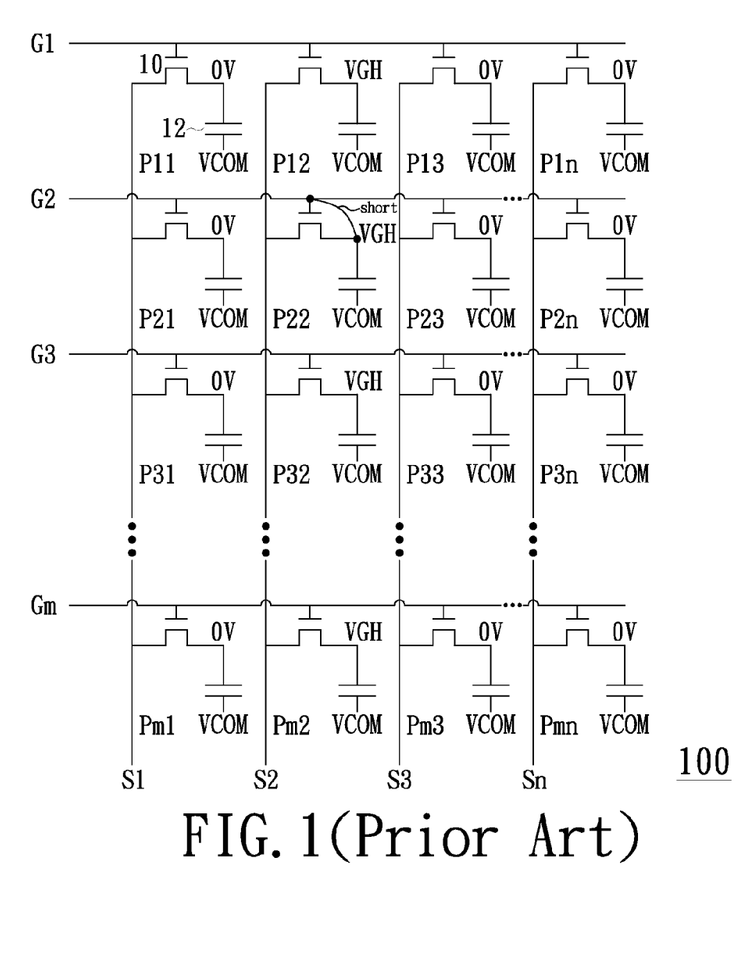
FIG. 1 is a schematic view of a conventional display panel.

FIG. 1 is a schematic view of a conventional display panel. As shown in FIG. 1, the conventional display panel 100 includes a plurality of gate lines G1~Gm and a plurality of source lines S1~Sn, where m, n are positive integers. The gate lines G1~Gm and the source lines S1~Sn are interlaced thereby forming a plurality of pixels P11~Pmn. For example, the pixel P11 is formed by the gate line G1 and the source line S1, the pixel P12 is formed by the gate line G1 and the source line S2, and so forth. Each pixel includes a transistor 10 and a capacitor 12. Each transistor 10 is configured to have its control end electrically connected to one of the plurality of gate lines G1~Gm, its first end electrically connected to one of the plurality of source lines S1~Sn, and its second end electrically connected to a first end of the respective capacitor 12. In addition, each capacitor 12 is configured to have its second end for receiving a common voltage Vcom. According to the aforementioned circuit configuration, each capacitor 12 receives the data voltage, transmitted by the respective source line, through the respective ON-state transistor 10.

The pixel P22 is took as an example for the following description. In the pixel P22, when a short-circuit path short occurs between the control end of the transistor 10 and the capacitor 12, the gate voltage VGH of the gate line G2 can be transmitted to the capacitor 12 through the short-circuit path short even no data voltage is transmitted on the source line S2 while the transistor 10 is ON by the gate voltage VGH of the gate line G2; and consequentially, the data voltage of the capacitor 12 is converted from 0V to VGH. Because the pixel P22 is not being supplied with any data voltage but the data stored in the capacitor 12 therein is converted from 0V to VGH, the abnormal brightness change generated by the pixel P22 and caused by the change of the data voltage stored in the capacitor 12 is commonly known as a bright dot.

Currently, the conventional bright dot detection method is realized through simultaneously transmitting the gate voltage VGH to all of the transistors 10 through the gate lines G1~Gm. Specifically, when any one of the pixels (for example, the pixel P22) has a defect, the gate voltage VGH of the gate line G2 is transmitted to the capacitor 12 through the short-circuit path short and is also transmitted to the source line S2 through the ON-state transistor 10 in the pixel P22; and consequentially, the voltage of the source line S2 is converted from 0V to VGH. Meanwhile because all of the transistors 10 are ON by the gate voltage VGH, all of the pixels P12, P22, . . . , Pm2 electrically connected to the source line S2, or all of the pixels in the same column with the pixel P22, have abnormal brightness change thereby forming a bright line. Through the bright line, the possible pixel(s) having bright dot is detected.

However, the conventional bright dot detection method can only determine the column/or row of the pixel(s) having bright dot but cannot actually position the pixel(s) having bright dot.

SUMMARY

Therefore, an aspect of the present disclosure is to provide a bright dot detection method capable of detecting and positioning the pixel with defect (or, bright dot).

Another aspect of the present disclosure is to provide a display panel employing the aforementioned bright dot detection method.

The present disclosure provides a bright dot detection method adapted to be used in a display panel including a plurality of gate lines, a plurality of source lines and a bright dot detection module. The plurality of gate lines and the plurality of sources line are interlaced thereby forming a plurality of pixels. The bright dot detection method includes: driving the plurality of pixels through enabling the plurality of gate lines simultaneously, thereby forming a first bright line in a first direction; and driving the plurality of pixels through enabling the plurality of gate lines sequentially and providing a control signal to the bright dot detection module, thereby forming a second bright line in a second direction, wherein a bright dot is positioned where the first and second bright lines meet with each other.

The present disclosure further provides display panel, which includes a plurality of gate lines, a plurality of source lines and a bright dot detection module. The plurality of gate lines and the plurality of source lines are interlaced thereby forming a plurality of pixels. The plurality of pixels are driven by the plurality of gate lines to corporately form a first bright line in a first direction. The bright dot detection module, electrically connected to the plurality of source lines, is configured to receive a control signal and configure the plurality of pixels to corporately form a second bright line in a second direction according to the control signal. A bright dot is positioned where the first and second bright lines meet with each other.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 2A:
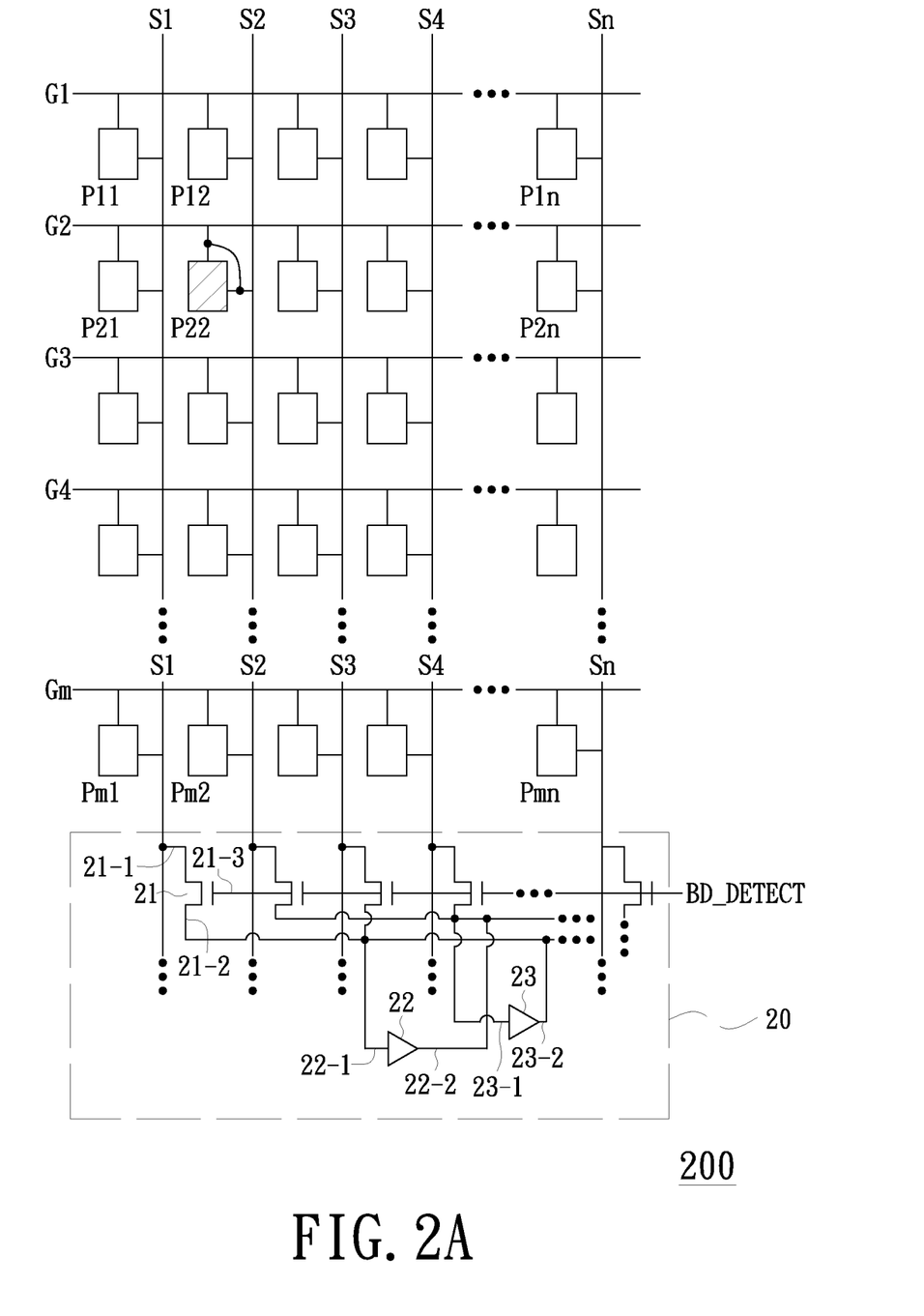
FIG. 2A is a schematic view of a display panel in accordance with an embodiment of the present disclosure.

FIG. 2A is a schematic view of a display panel in accordance with an embodiment of the present disclosure. As shown in FIG. 2A, the display panel 200 in the present embodiment includes a plurality of gate lines G1~Gm, a plurality of source lines S1~Sn and a bright dot detection module 20, wherein m, n are positive integers. The gate lines G1~Gm and the source lines S1~Sn are interlaced thereby forming a plurality of pixels P11~Pmn. For example, the pixel P11 is formed by the gate line G1 and the source line S1, the pixel P12 is formed by the gate line G1 and the source line S2, and so forth.

Figure 2B:
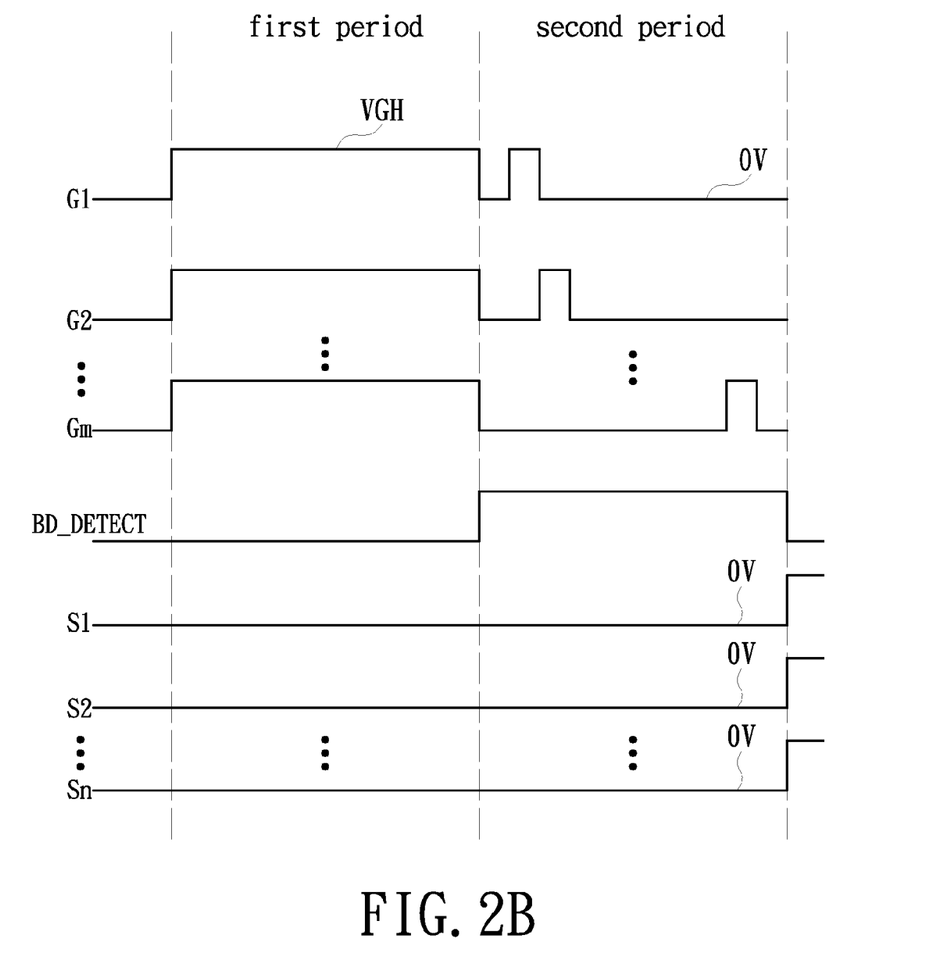
FIG. 2B is a timing chart of the related signals for configuring the display panel of FIG. 1 to perform a bright dot detection in accordance with an embodiment of the present disclosure.
Figure 2C:
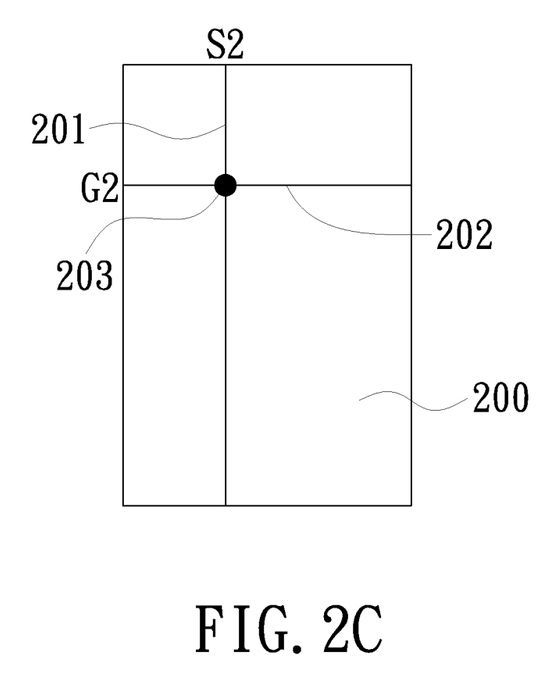
FIG. 2C is a schematic view illustrating a bright dot formed on the display panel of FIG. 1.

FIG. 2B is a timing chart of the related signals for configuring the display panel of FIG. 1 to perform a bright dot detection in accordance with an embodiment of the present disclosure. FIG. 2C is a schematic view illustrating a bright dot formed on the display panel of FIG. 1. Please refer to FIGS. 2A, 2B and 2C, together. When the display panel 200 performs the bright dot detection and is operated in a first period, the pixels P11~Pmn are simultaneously driven by transmitting gate voltages with voltage level VGH to the pixels P11~Pmn through the respective gate lines G1~Gm; thus, a first bright line in a first direction is formed by the pixel having a bright dot in the driven pixels P11~Pmn. For example, as exemplarily illustrated in FIG. 2C, a vertical bright line 201 is formed in the column direction when the display panel 200 performs the bright dot detection and is operated in the first period. The bright dot detection module 20 is electrically connected to the source lines S1~Sn. Specifically, when the display panel 200 performs the bright dot detection and is operated in a second period, the pixels P11~Pmn are sequentially driven row by row by transmitting gate voltages with voltage level VGH to the pixels P11~Pmn through the respective gate lines G1~Gm and a control signal BD_DETECT is provided to the bright dot detection module 20; thus, a second bright line in a second direction is formed by the pixel having a bright dot in the driven pixels P11~Pmn. For example, as exemplarily illustrated in FIG. 2C, a horizontal bright line 202 is formed in the row direction when the display panel 200 performs the bright dot detection and is operated in the second period. Thus, the position of the bright dot 203 is determined at the meeting point of the vertical bright line 201 and the horizontal bright line 202. To facilitate a better understanding of the present disclosure, it is to be noted that the display panel 200 is exemplified by having one bright dot 203 only as illustrated in FIG. 2C; however, the present disclosure is not limited thereto. In addition, it is to be noted that no data voltage is transmitted to the pixels P11~Pmn through the source lines S1~Sn when the display panel 200 performs the bright dot detection; in other words, when the display panel 200 performs the bright dot detection, the data voltages transmitted to the pixels P11~Pmn through the source lines S1~Sn are substantial 0V.

As shown in FIG. 2A, the bright dot detection module 20 includes a plurality of transistors 21 and two signal amplification units 22, 23. Each transistor 21 has a first end 21-1, a second end 21-2 and a control end 21-3. Each transistor 21 is configured to have its control end 21-3 for receiving the control signal BD_DETECT and its first end 21-1 electrically connected to one of the source lines S1~Sn. The signal amplification unit 22 has an input end 22-1 and an output end 22-2. The signal amplification unit 23 has an input end 23-1 and an output end 23-2. The signal amplification unit 23 is configured to have its input end 23-1 electrically connected to the output end 22-2 of the signal amplification unit 22 and its output end 23-2 electrically connected to the input end 22-1 of the signal amplification unit 22. In addition, the transistors 21, electrically connected to the odd-numbered source lines (e.g., source lines S1, S3 . . . ), are configured to have their second ends 21-2 electrically connected to the input end 22-1 of the signal amplification unit 22. The transistors 21, electrically connected to the even-numbered source lines (e.g., source lines S2, S4 . . . ), are configured to have their second ends 21-2 electrically connected to the input end 23-1 of the signal amplification unit 23.

In the present embodiment, when any one of the pixels P11~Pmn has a bright dot and accordingly generates a short circuit signal, the short circuit signal is amplified by either the signal amplification unit 22 or 23 first and then transmitted to all of the source lines S1~Sn. Thus, the pixel generating the short circuit signal as well as the pixels electrically connected to the same gate line with the pixel generating the short circuit signal corporately form the second bright line in the second direction, such as the horizontal bright line 202 is formed in the row direction as illustrated in FIG. 2C. The detail of the formation of the bright line and the position determination of the bright dot will be described as follow.

Please refer to FIGS. 2A, 2B and 2C. As described above, all the pixels P11~Pmn are simultaneously driven when the display panel 200 performs the bright dot detection and is operated in the first period. Thus, when any one of the pixels P11~Pmn (herein the pixel P22 is took as an example) has a bright dot, a short circuit (which may be caused by a transistor (not shown) in the pixel P22) may occur between the gate line G2 and the source line S2; and accordingly, the voltage level of the source line S2 electrically connected to the pixel P22 is pulled up to the voltage level VGH. Because all of the pixels P12, P22 . . . Pm2 electrically connected to the source line S2 are simultaneously driven by the gate voltage with voltage level VGH, as a result, the pixels P12, P22 . . . Pm2 electrically connected to the source line S2 corporately form the vertical bright line 201 in the column direction when the display panel 200 performs the bright dot detection and is operated in the first period. As described above, the pixels P11~Pmn are sequentially driven row by row by sequentially transmitting the gate voltage with voltage level VGH to the pixels P11~Pmn through the respective gate lines G1~Gm when the display panel 200 performs the bright dot detection and is operated in the second period. Thus, when the pixel P22 has a bright dot and is being driven by the gate voltage with voltage level VGH transmitted on the gate line G2, the voltage level of the source line S2 electrically connected to the pixel P22 is pulled up to the voltage level VGH. In addition, because meanwhile all of the transistors 21 in the bright dot detection module 20 are ON by being supplied with the control signal BD_DETECT through the control ends 21-3 thereof and the odd-numbered source lines (e.g., source lines S1, S3 . . . ) and the even-numbered source lines (e.g., source lines S2, S4 . . . ) are electrically connected to the input end 22-1 of the signal amplification unit 22 and the input end 23-1 of the signal amplification unit 23 through respective transistors 21, respectively, the voltage level VGH of the source line S2 is further transmitted to the signal amplification unit 23 for signal amplification. The amplified signal outputted from the output end 23-2 of the signal amplification unit 23 is then transmitted to the odd-numbered source lines (e.g., source lines S1, S3 . . . ) and the input end 22-1 of the signal amplification unit 22 for signal amplification. The amplified signal outputted from the output end 22-2 of the signal amplification unit 22 is then transmitted to the even-numbered source lines (e.g., source lines S2, S4 . . . ). As a result, all of the source lines S1~Sn have a voltage level substantially greater than or equal to the voltage level VGH. It is to be noted that meanwhile the pixels P21~P2n are being driven by the gate voltage with voltage level VGH transmitted by the gate line G2, thus, the pixels P21, P22 . . . P2n corporately form the horizontal bright line 202 in the row direction when the display panel 200 performs the bright dot detection and is operated in the second period. In addition, it is understood that the bright point 203 where the bright lines 201, 202 meet with each other is the pixel 22.

It is to be noted that the colors of the bright lines 201, 202 in FIG. 2C are related to the pixel arrangement of the display panel 200. The bright dot detection used in a plurality of display panels with different pixel arrangements will be disclosed as follow.

Figure 3:
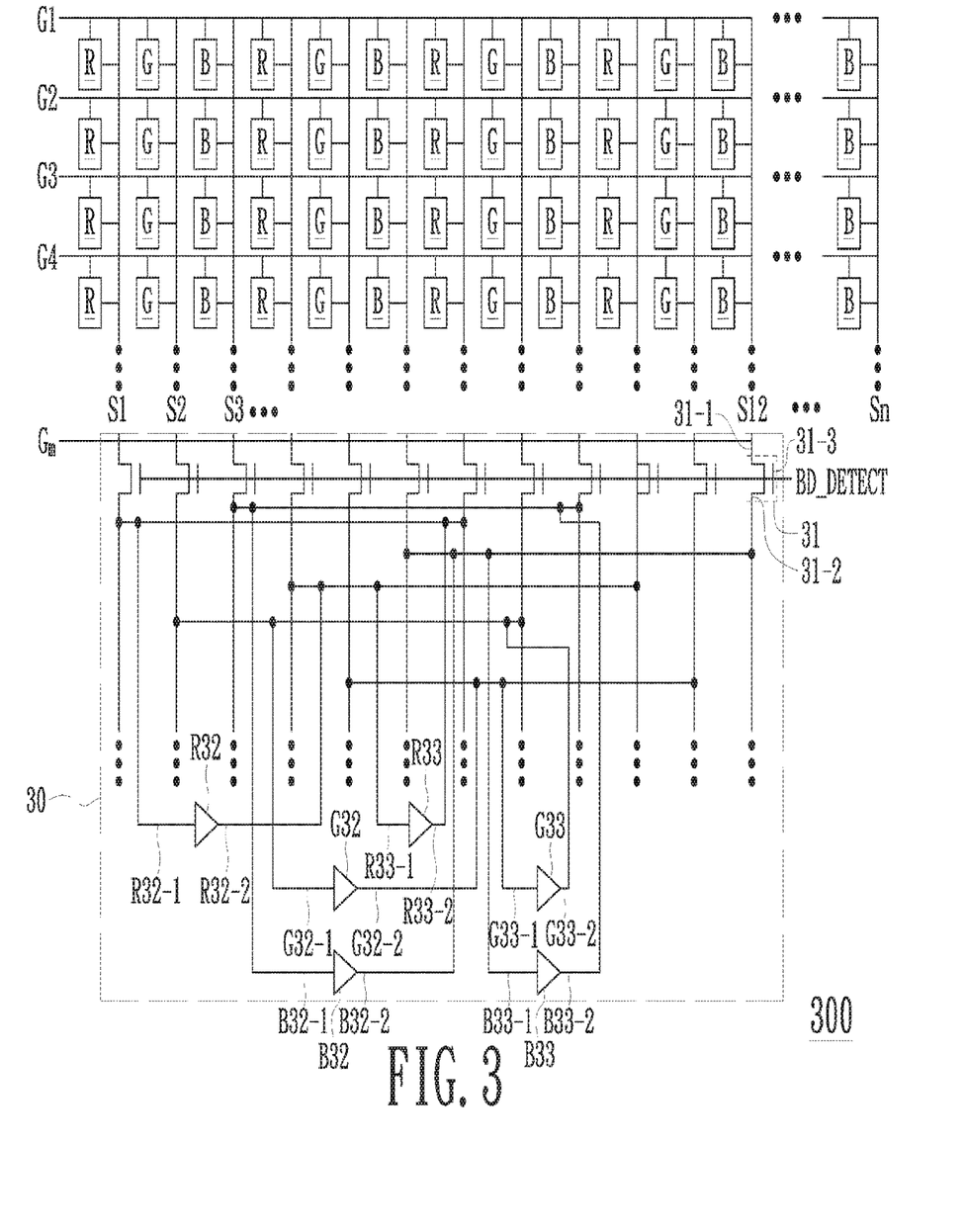
FIG. 3 is a schematic view illustrating a pixel arrangement of a display panel in accordance with an embodiment of the present disclosure.

FIG. 3 is a schematic view illustrating a pixel arrangement of a display panel in accordance with an embodiment of the present disclosure. As shown in FIG. 3, the display panel 300 in the present embodiment includes a plurality of gate lines G1~Gm, a plurality of source lines S1~Sn and a bright dot detection module 30. The gate lines G1~Gm and the source lines S1~Sn are interlaced thereby forming a plurality of red sub-pixels R, a plurality of green sub-pixels G and a plurality of blue sub-pixels B. The sub-pixels in the same row are corporately electrically connected to one of the gate lines G1~Gm and the sub-pixels in the same column are corporately electrically connected to one of the source lines S1~Sm. The process of the bright dot detection in the display panel 300 is same as that in the display panel 200, and no redundant detail is to be given herein. As shown in the display panel 300 of FIG. 3, because the sub-pixels in the same column have the same color, the vertical bright line in the column direction is red, green or blue. On the contrary, because the sub-pixels in the same row have red, green and blue colors in sequence, the horizontal bright line in the row direction has a color mixed by red, green and blue (for example, white color).

As shown in FIG. 3, the bright dot detection module 30 includes a plurality of transistors 31 and six signal amplification units R32, R33, G32, G33, B32 and B33. Each transistor 31 has a first end 31-1, a second end 31-2 and a control end 31-3. Each transistor 31 is configured to have its control end 31-3 for receiving the control signal BD_DETECT and its first end 31-1 electrically connected to one of the source lines S1~Sn. The signal amplification unit R32 has an input end R32-1 and an output end R32-2. The signal amplification unit R33 has an input end R33-1 and an output end R33-2. The signal amplification unit R33 is configured to have its input end R33-1 electrically connected to the output end R32-2 of the signal amplification unit R32 and its output end R33-2 electrically connected to the input end R32-1 of the signal amplification unit R32. In addition, the signal amplification unit G32 has an input end G32-1 and an output end G32-2. The signal amplification unit G33 has an input end G33-1 and an output end G33-2. The signal amplification unit G33 is configured to have its input end G33-1 electrically connected to the output end G32-2 of the signal amplification unit G32 and its output end G33-2 electrically connected to the input end G32-1 of the signal amplification unit G32. The signal amplification unit B32 has an input end B32-1 and an output end B32-2. The signal amplification unit B33 has an input end B33-1 and an output end B33-2. The signal amplification unit B33 is configured to have its input end B33-1 electrically connected to the output end B32-2 of the signal amplification unit B32 and its output end B33-2 electrically connected to the input end B32-1 of the signal amplification unit B32.

Please continue to refer to FIG. 3. The transistor 31, electrically connected to the (6n−5)th in the source lines S1~Sn, is configured to have its second end 31-2 electrically connected to the input end R32-1 of the signal amplification unit R32. The transistor 31, electrically connected to the (6n−2)th in the source lines S1~Sn, is configured to have its second end 31-2 electrically connected to the input end R33-1 of the signal amplification unit R33. The transistor 31, electrically connected to the (6n−4)th in the source lines S1~Sn, is configured to have its second end 31-2 electrically connected to the input end G32-1 of the signal amplification unit G32. The transistor 31, electrically connected to the (6n−1)th in the source lines S1~Sn, is configured to have its second end 31-2 electrically connected to the input end G33-1 of the signal amplification unit R33. The transistor 31, electrically connected to the (6n−3)th in the source lines S1~Sn, is configured to have its second end 31-2 electrically connected to the input end B32-1 of the signal amplification unit B32. The transistor 31, electrically connected to the (6n)th in the source lines S1~Sn, is configured to have its second end 31-2 electrically connected to the input end B33-1 of the signal amplification unit B33. In the present embodiment, the aforementioned n is a positive integer, and the connection relationship of the bright dot detection module 30 in FIG. 3 is exemplified by having n being 1 and 2 only.

Please continue to refer to FIG. 3. When any one of the sub-pixels R electrically connected to the (3n−2)th in the source lines S1~Sn has a bright dot and accordingly generates a short circuit signal, a first red bright line is formed in the first direction (i.e., the column direction) according to the short circuit signal. In addition, the short circuit signal is amplified by at least one of the signal amplification unit R32 and R33 first and then transmitted to all of the sub-pixels electrically connected to the (3n−2)th in the source lines S1~Sn thereby forming a second red bright line in the second direction (i.e., the row direction).

Similarly, when any one of the sub-pixels G electrically connected to the (3n−1)th in the source lines S1~Sn has a bright dot and accordingly generates the short circuit signal, a first green bright line is formed in the first direction (i.e., the column direction) according to the short circuit signal. In addition, the short circuit signal is amplified by at least one of the signal amplification unit G32 and G33 first and then transmitted to all of the remaining sub-pixels electrically connected to the (3n−1)th in the source lines S1~Sn thereby forming a second green bright line in the second direction (i.e., the row direction).

Similarly, when any one of the sub-pixels B electrically connected to the (3n)th in the source lines S1~Sn has a bright dot and accordingly generates the short circuit signal, a first blue bright line is formed in the first direction (i.e., the column direction) according to the short circuit signal. In addition, the short circuit signal is amplified by at least of the signal amplification unit B32 and B33 first and then transmitted to all of the remaining sub-pixels electrically connected to the (3n)th in the source lines S1~Sn thereby forming a second blue bright line in the second direction (i.e., the row direction).

The amplification and transmission of the short circuit signal when the display panel 300 of FIG. 3 performs the bright dot detection are same as that the display panel 200 of FIG. 2, and no redundant detail is to be given herein. In addition, it is to be noted that because the display panel 300 of FIG. 3 employs six signal amplification units for the signal amplification and transmission, a bright line with certain color can be obtained. As a result, not only the sub-pixel having bright dot can be positioned, but also the color of the sub-pixel having bright dot can be determined according to the color of the bright line.

Figure 4:
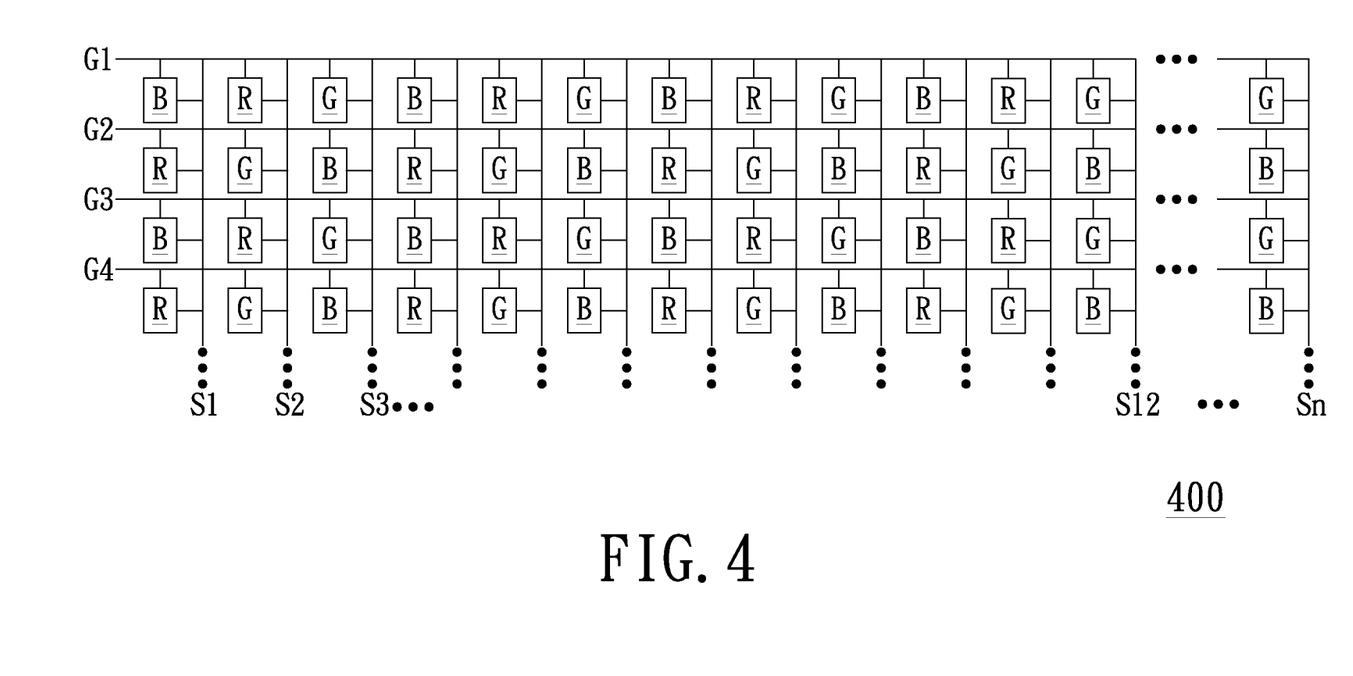
FIG. 4 is a schematic view illustrating a pixel arrangement of a display panel in accordance with another embodiment of the present disclosure.

FIG. 4 is a schematic view illustrating a pixel arrangement of a display panel in accordance with another embodiment of the present disclosure. As shown in FIG. 4, the display panel 400 in the present embodiment includes a plurality of gate lines G1~Gm and a plurality of source lines S1~Sn. The gate lines G1~Gm and the source lines S1~Sn are interlaced thereby forming a plurality of red sub-pixels R, a plurality of green sub-pixels G and a plurality of blue sub-pixels B. Each sub-pixel is electrically connected to one of the gate lines G1~Gm and one of the source lines S1~Sn. Specifically, the sub-pixels in the same row are corporately electrically connected to one of the gate lines G1~Gm and each two adjacent sub-pixels in the same row are electrically connected to different source lines, and each two adjacent pixels in the same column are electrically connected to the same source line. Even the display panel 400 of FIG. 4 and the display panel 300 of FIG. 3 have different sub-pixel arrangements and different connection between the sub-pixels and gate/source lines, the bright dot detection process used in the display panel 300 is also applied to the display panel 400; thus, no redundant detail is to be given herein. In addition, it is understood that the bright dot detection module including six signal amplification units as illustrated in the display panel 300 of FIG. 3 may be also applied to the display panel 400 of FIG. 4. Thus, through the color of the bright line formed in the row direction, the color of the sub-pixel with bright dot is determined.

Figure 5:
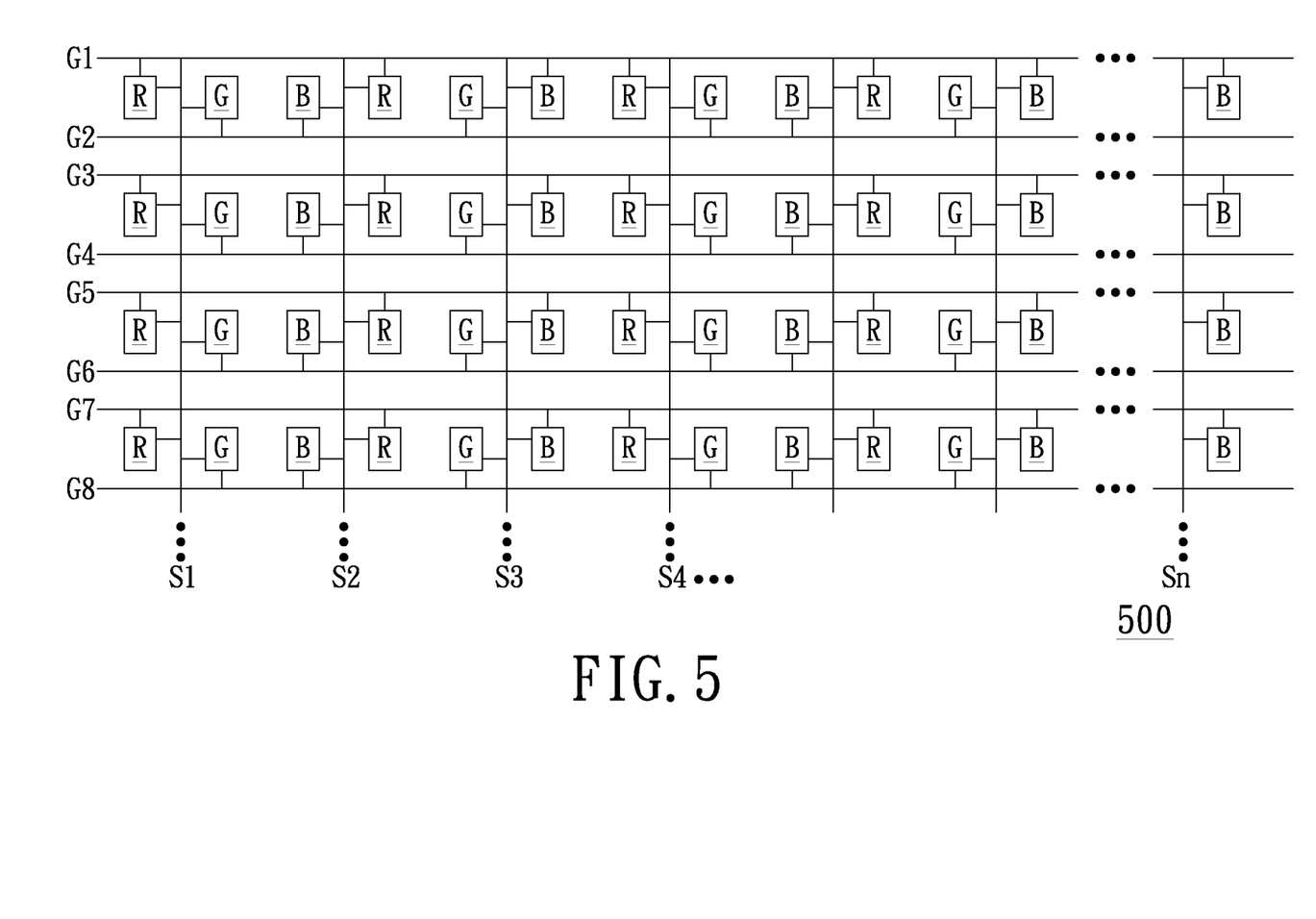
FIG. 5 is a schematic view illustrating a pixel arrangement of a display panel in accordance with still another embodiment of the present disclosure.

FIG. 5 is a schematic view illustrating a pixel arrangement of a display panel in accordance with still another embodiment of the present disclosure. As shown in FIG. 5, the display panel 500 in the present embodiment includes a plurality of gate lines G1~Gm and a plurality of source lines S1~Sn. The gate lines G1~Gm and the source lines S1~Sn are interlaced thereby forming a plurality of red sub-pixels R, a plurality of green sub-pixels G and a plurality of blue sub-pixels B. Each sub-pixel is electrically connected to one of the gate lines G1~Gm and one of the source lines S1~Sn. Specifically, the sub-pixels in the $m_{th}$ row are corporately electrically connected to the $(2m-1)_{th}$ or $(2m)_{th}$ out of the gate lines G1~Gm and the sub-pixels in the $(2m-1)_{th}$ or $(2m)_{th}$ columns are corporately electrically connected to the $m_{th}$ out of the source lines S1~Sn; wherein m is a positive integer.

Even the display panel 500 of FIG. 5 and the display panels 300, 400 of FIGS. 3, 4 have different sub-pixel arrangements and different connection between the sub-pixels and gate/source lines, the aforementioned bright dot detection process is also applied to the display panel 500; thus, no redundant detail is to be given herein.

Figure 6:
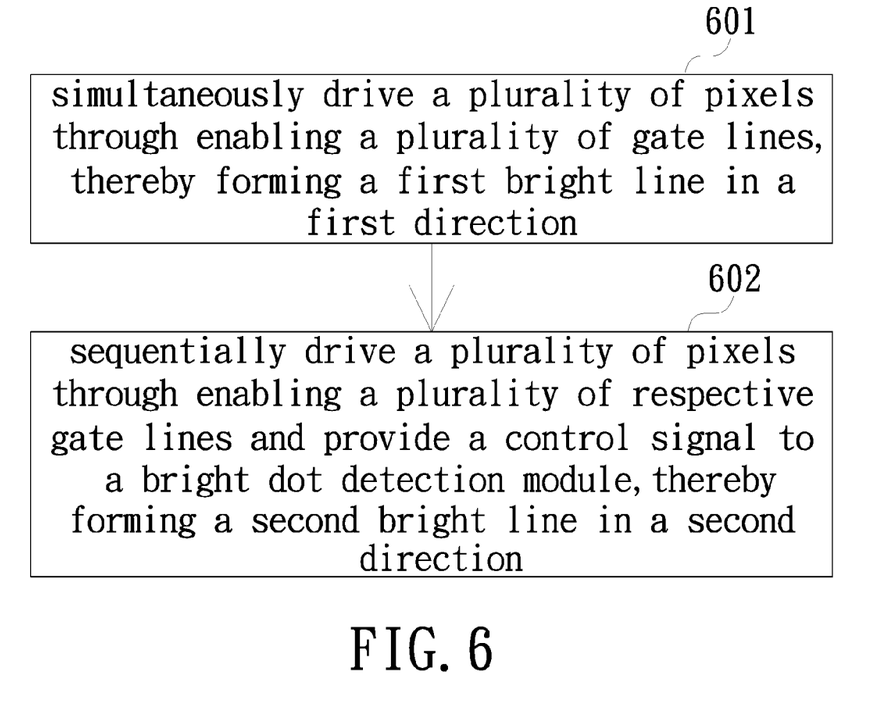
FIG. 6 is a flow char of a bright dot detection method in accordance with an embodiment of the present disclosure.

According to the display panels disclosed in the previous embodiment, a bright dot detection method is developed. FIG. 6 is a flow char of a bright dot detection method in accordance with an embodiment of the present disclosure. As shown in FIG. 6, the bright dot detection method in the present embodiment includes steps of: simultaneously driving a plurality of pixels through enabling a plurality of gate lines, thereby forming a first bright line in a first direction (step 601); and sequentially driving a plurality of pixels through enabling a plurality of respective gate lines and providing a control signal to a bright dot detection module, thereby forming a second bright line in a second direction (step 602).

In summary, the bright dot detection method of the present disclosure is adapted to use in a display panel equipped with a bright dot detection module. The display panel includes a plurality of gate lines and a plurality of source lines, which are interlaced to form a plurality of pixels. The bright dot detection module includes a plurality of transistors and at least two signal amplification units. When the display panel performs the bright dot detection and is operated in the first period, the plurality of pixels are simultaneously driven through enabling the plurality of gate lines, so the short circuit signal generated by the pixel with defect (for example, a bright dot) configures the pixels electrically connected to the same source line with the pixel with defect to corporately form the first bright line in the first direction. When the display panel performs the bright dot detection and is operated in the second period, the plurality of pixels are sequentially driven through enabling the plurality of respective gate lines, the control signal is provided to the bright dot detection module, and the short circuit signal generated by the pixel with defect is amplified by the respective signal amplification unit and then transmitted to the corresponding source line, thereby forming the second bright line in the second direction. Thus, the pixel with defect is positioned where the first and second bright lines meet with each other.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bright dot detection method, adapted to be used in a display panel comprising a plurality of gate lines, a plurality of source lines and a bright dot detection module, the plurality of gate lines and the plurality of sources line being interlaced thereby forming a plurality of pixels, the bright dot detection method comprising:
    driving the plurality of pixels through enabling the plurality of gate lines simultaneously, thereby forming a first bright line in a first direction; and
    driving the plurality of pixels through enabling the plurality of gate lines sequentially and providing a control signal to the bright dot detection module, thereby forming a second bright line in a second direction,
    wherein a bright dot is positioned where the first and second bright lines meet with each other.

2. The bright dot detection method according to claim 1, wherein the bright dot detection module comprises:
    a plurality of transistors, each one of the plurality of transistor having a first end, a second end and a control end and being configured to have its control end for receiving the control signal and its first end electrically connected to one of the plurality of source lines;
    a first signal amplification unit, having an input end and an output end; and
    a second signal amplification unit, having an input end and an output end, the second signal amplification unit being configured to have its input end electrically connected to the output end of the first signal amplification unit and its output end electrically connected to the input end of the first signal amplification unit, wherein the transistors, electrically connected to the odd-numbered source lines, are configured to have their second ends electrically connected to the input end of the first signal amplification unit, wherein the transistors, electrically connected to the even-numbered source lines, are configured to have their second ends electrically connected to the input end of the second signal amplification unit, wherein when any one of the plurality of pixels generates a short circuit signal, the short circuit signal configures the pixels electrically connected to the same source line with the pixel generating the short circuit signal to corporately form the first bright line in the first direction, wherein the short circuit signal is amplified by either the first signal amplification unit or the second signal amplification unit and then transmitted to all of the source lines, thereby configuring the pixels electrically connected to the same gate line with the pixel generating the short circuit signal to corporately form the second bright line in the second direction.

3. A display panel, comprising:
a plurality of gate lines;
a plurality of source lines, wherein the plurality of gate lines and the plurality of source lines are interlaced thereby forming a plurality of pixels; and
a bright dot detection module, electrically connected to the plurality of source lines, wherein the bright dot detection module is configured to receive a control signal, and the bright dot detection module comprises:
a plurality of transistors, each one of the plurality of transistor having a first end, a second end and a control end and being configured to have its control end for receiving the control signal and its first end electrically connected to one of the plurality of source lines;
a first signal amplification unit, having an input end and an output end; and
a second signal amplification unit, having an input end and an output end, the second signal amplification unit being configured to have its input end electrically connected to the output end of the first signal amplification unit and its output end electrically connected to the input end of the first signal amplification unit, wherein the transistors, electrically connected to the odd-numbered source lines, are configured to have their second ends electrically connected to the input end of the first signal amplification unit, wherein the transistors, electrically connected to the even-numbered source lines, are configured to have their second ends electrically connected to the input end of the second signal amplification unit, wherein when any one of the plurality of pixels generates a short circuit signal, the short circuit signal configures the plurality of pixels to corporately form a first bright line in a first direction, wherein the short circuit signal is amplified by either the first signal amplification unit or the second signal amplification unit and then transmitted to all of the source lines, thereby configuring the pixels electrically connected to the same gate line with the pixel generating the short circuit signal to corporately form a second bright line in a second direction.

4. The display panel according to claim 3, wherein each one of the plurality of pixels comprises at least three sub-pixels with different colors, each one of the plurality of sub-pixels is electrically connected to one of the plurality of source lines and one of the plurality of gate lines, the sub-pixels in the same row are electrically connected to one of the plurality of gate lines and the sub-pixels in the same column are electrically connected to one of the plurality of source lines.

5. The display panel according to claim 4, wherein the bright dot detection module comprises:
a plurality of transistors, each one of the plurality of transistor having a first end, a second end and a control end and being configured to have its control end for receiving the control signal and its first end electrically connected to one of the plurality of source lines;
a first signal amplification unit, having an input end and an output end;
a second signal amplification unit, having an input end and an output end, the second signal amplification unit being configured to have its input end electrically connected to the output end of the first signal amplification unit and its output end electrically connected to the input end of the first signal amplification unit;
a third signal amplification unit, having an input end and an output end;
a fourth signal amplification unit, having an input end and an output end, the fourth signal amplification unit being configured to have its input end electrically connected to the output end of the third signal amplification unit and its output end electrically connected to the input end of the third signal amplification unit;
a fifth signal amplification unit, having an input end and an output end;
a sixth signal amplification unit, having an input end and an output end, the sixth signal amplification unit being configured to have its input end electrically connected to the output end of the fifth signal amplification unit and its output end electrically connected to the input end of the fifth signal amplification unit, wherein the transistors, electrically connected to a $(6n-5)_{th}$ in the plurality of source lines, are configured to have their second ends electrically connected to the input end of the first signal amplification unit, wherein the transistors, electrically connected to a $(6n-2)_{th}$ in the plurality of source lines, are configured to have their second ends electrically connected to the input end of the second signal amplification unit, wherein the transistors, electrically connected to a $(6n-4)_{th}$ in the plurality of source lines, are configured to have their second ends electrically connected to the input end of the third signal amplification unit, wherein the transistors, electrically connected to a $(6n-1)_{th}$ in the plurality of source lines, are configured to have their second ends electrically connected to the input end of the fourth signal amplification unit, wherein the transistors, electrically connected to a $(6n-3)_{th}$ in the plurality of source lines, are configured to have their second ends electrically connected to the input end of the fifth signal amplification unit, wherein the transistors, electrically connected to a $(6n)_{th}$ in the plurality of source lines, are configured to have their second ends electrically connected to the input end of the sixth signal amplification unit, wherein n is a positive integer.

6. The display panel according to claim 5, wherein when any one of the sub-pixels electrically connected to a $(3n-2)_{th}$ in the plurality of source lines generates a short circuit signal, the short circuit signal configures the plurality of sub-pixels to corporately form the first bright line in the first direction, wherein the short circuit signal is amplified by at least one of the first signal amplification unit and the second signal amplification unit and then transmitted to the sub-pixels electrically connected to the $(3n-2)_{th}$ in the plurality of source lines, thereby forming the second bright line.

7. The display panel according to claim 5, wherein when any one of the sub-pixels electrically connected to a $(3n-1)_{th}$ in the plurality of source lines generates a short circuit signal, the short circuit signal configures the plurality of sub-pixels to corporately form the first bright line in the first direction, wherein the short circuit signal is amplified by at least one of the third signal amplification unit and the fourth signal amplification unit and then transmitted to the sub-pixels electrically connected to the $(3n-1)_{th}$ in the plurality of source lines, thereby forming the second bright line.

8. The display panel according to claim 5, wherein when any one of the sub-pixels electrically connected to a $(3n)_{th}$ in the plurality of source lines generates a short circuit signal, the short circuit signal configures the plurality of sub-pixels to corporately form the first bright line in the first direction, wherein the short circuit signal is amplified by at least one of the fifth signal amplification unit and the sixth signal amplification unit and then transmitted to the sub-pixels electrically connected to the $(3n)_{th}$ in the plurality of source lines, thereby forming the second bright line.

9. The display panel according to claim 3, wherein each one of the plurality of pixels comprises at least three sub-pixels with different colors, each one of the plurality of sub-pixels is electrically connected to one of the plurality of source lines and one of the plurality of gate lines, the sub-pixels in the same row are electrically connected to one of the plurality of gate lines and each two adjacent pixels in the same column are electrically connected to the same source line, and each two adjacent pixels in the same row are electrically connected to different source lines.

10. The display panel according to claim 9, wherein the bright dot detection module comprises:
a plurality of transistors, each one of the plurality of transistor having a first end, a second end and a control end and being configured to have its control end for receiving the control signal and its first end electrically connected to one of the plurality of source lines;
a first signal amplification unit, having an input end and an output end;
a second signal amplification unit, having an input end and an output end, the second signal amplification unit being configured to have its input end electrically connected to the output end of the first signal amplification unit and its output end electrically connected to the input end of the first signal amplification unit;
a third signal amplification unit, having an input end and an output end;
a fourth signal amplification unit, having an input end and an output end, the fourth signal amplification unit being configured to have its input end electrically connected to the output end of the third signal amplification unit and its output end electrically connected to the input end of the third signal amplification unit;
a fifth signal amplification unit, having an input end and an output end;
a sixth signal amplification unit, having an input end and an output end, the sixth signal amplification unit being configured to have its input end electrically connected to the output end of the fifth signal amplification unit and its output end electrically connected to the input end of the fifth signal amplification unit, wherein the transistors, electrically connected to a $(6n-5)_{th}$ in the plurality of source lines, are configured to have their second ends electrically connected to the input end of the first signal amplification unit, wherein the transistors, electrically connected to a $(6n-2)_{th}$ in the plurality of source lines, are configured to have their second ends electrically connected to the input end of the second signal amplification unit, wherein the transistors, electrically connected to a $(6n-4)_{th}$ in the plurality of source lines, are configured to have their second ends electrically connected to the input end of the third signal amplification unit, wherein the transistors, electrically connected to a $(6n-1)_{th}$ in the plurality of source lines, are configured to have their second ends electrically connected to the input end of the fourth signal amplification unit, wherein the transistors, electrically connected to a $(6n-3)_{th}$ in the plurality of source lines, are configured to have their second ends electrically connected to the input end of the fifth signal amplification unit, wherein the transistors, electrically connected to a $(6n)_{th}$ in the plurality of source lines, are configured to have their second ends electrically connected to the input end of the sixth signal amplification unit, wherein n is a positive integer.

11. The display panel according to claim 9, wherein when any one of the sub-pixels electrically connected to a $(3n-2)_{th}$ in the plurality of source lines generates a short circuit signal, the short circuit signal configures the plurality of sub-pixels to corporately form the first bright line in the first direction, wherein the short circuit signal is amplified by at least one of the first signal amplification unit and the second signal amplification unit and then transmitted to the sub-pixels electrically connected to the $(3n-2)_{th}$ in the plurality of source lines, thereby forming the second bright line.

12. The display panel according to claim 9, wherein when any one of the sub-pixels electrically connected to a $(3n-1)_{th}$ in the plurality of source lines generates a short circuit signal, the short circuit signal configures the plurality of sub-pixels to corporately form the first bright line in the first direction, wherein the short circuit signal is amplified by at least one of the third signal amplification unit and the fourth signal amplification unit and then transmitted to the sub-pixels electrically connected to the $(3n-1)_{th}$ in the plurality of source lines, thereby forming the second bright line.

13. The display panel according to claim 9, wherein when any one of the sub-pixels electrically connected to a $(3n)_{th}$ in the plurality of source lines generates a short circuit signal, the short circuit signal configures the plurality of sub-pixels to corporately form the first bright line in the first direction, wherein the short circuit signal is amplified by at least one of the fifth signal amplification unit and the sixth signal amplification unit and then transmitted to the sub-pixels electrically connected to the $(3n)_{th}$ in the plurality of source lines, thereby forming the second bright line.

14. The display panel according to claim 3, wherein each one of the plurality of pixels comprises at least three sub-pixels with different colors, each one of the plurality of sub-pixels is electrically connected to one of the plurality of source lines and one of the plurality of gate lines, the sub-pixels in a $m_{th}$ row are electrically connected to $(2m-1)_{th}$ or $2m_{th}$ in the plurality of gate lines, and the sub-pixels in $(2m-1)_{th}$ or $(2m)_{th}$ columns are electrically connected to a $m_{th}$ in the plurality of source lines, wherein m is a positive integer.

* * * * *